United States Patent
Kim et al.

(10) Patent No.: US 11,152,583 B2
(45) Date of Patent: Oct. 19, 2021

(54) ORGANIC LIGHT-EMITTING DIODE CONTAINING CO-HOSTS FORMING EXCIPLEX, AND LIGHTING DEVICE AND DISPLAY APPARATUS INCLUDING SAME

(71) Applicant: SAMSUNG ELECTRONICS CO., LTD., Suwon-si (KR)

(72) Inventors: Jang Joo Kim, Seoul (KR); Young Seo Park, Seoul (KR); Sung Hun Lee, Seoul (KR); Kwon Hyeon Kim, Changwon-si (KR)

(73) Assignee: SAMSUNG ELECTRONICS CO., LTD, Gyeonggi-do (KR)

( * ) Notice: Subject to any disclaimer, the term of this patent is extended or adjusted under 35 U.S.C. 154(b) by 0 days.

(21) Appl. No.: 16/197,842

(22) Filed: Nov. 21, 2018

(65) Prior Publication Data
US 2019/0097155 A1    Mar. 28, 2019

Related U.S. Application Data

(63) Continuation of application No. 14/391,610, filed as application No. PCT/KR2013/002980 on Apr. 10, 2013, now Pat. No. 10,177,329.

(30) Foreign Application Priority Data

Apr. 10, 2012    (KR) .................. 10-2012-0037560

(51) Int. Cl.
*H01L 51/50* (2006.01)
*H01L 51/00* (2006.01)

(52) U.S. Cl.
CPC ...... *H01L 51/5016* (2013.01); *H01L 51/5004* (2013.01); *H01L 51/5024* (2013.01);
(Continued)

(58) Field of Classification Search
CPC ............ H01L 51/0054; H01L 51/0059; H01L 51/0085; H01L 51/5004; H01L 51/5016;
(Continued)

(56) References Cited

U.S. PATENT DOCUMENTS 5,955,836 A * 9/1999 Boerner ................. H05B 33/14
                                                             313/506
2005/0221116 A1 10/2005 Cocchi et al.
(Continued)

FOREIGN PATENT DOCUMENTS

JP       2001313180       11/2001
KR     1020010092905      10/2001
(Continued)

OTHER PUBLICATIONS

Park, Y. et al. "Energy Transfer from Exciplexes to Dopants and its Effect on Efficiency of Organic Light-Emitting Diodes." Journal of Applied Physics 110, 124519 (2011) of record. (Year: 2011).*
(Continued)

*Primary Examiner* — Eduardo A Rodela
*Assistant Examiner* — Christopher M Roland
(74) *Attorney, Agent, or Firm* — Cantor Colburn LLP

(57) ABSTRACT

Provided are an organic light-emitting diode ("OLED") including a bottom electrode, a top electrode disposed opposite to the bottom electrode, and an organic layer that is interposed between the bottom electrode and the top electrode and includes a hole-transporting host and an electron-transporting host forming an exciplex and a phosphorescent dopant having a triplet energy which is lower than the triplet energy of the hole-transporting host, the triplet energy of the electron-transporting host, and the triplet energy of the exciplex, and a lighting device and a display apparatus including the OLED. Instead of a phosphorescent dopant, the fluorescent dopant having a singlet energy which is
(Continued)

lower than the singlet energy of the exciplex may be also used.

7 Claims, 14 Drawing Sheets

(52) U.S. Cl.
CPC ........ *H01L 51/008* (2013.01); *H01L 51/0054* (2013.01); *H01L 51/0059* (2013.01); *H01L 51/0085* (2013.01); *H01L 2251/5384* (2013.01); *H01L 2251/552* (2013.01)

(58) Field of Classification Search
CPC ......... H01L 51/5024; H01L 2251/5384; H01L 2251/552; H01L 51/008
See application file for complete search history.

(56) References Cited

U.S. PATENT DOCUMENTS

| | | | |
|---|---|---|---|
| 2006/0279204 A1* | 12/2006 | Forrest | H01L 51/5004 313/506 |
| 2008/0074034 A1 | 3/2008 | Jou | |
| 2008/0074038 A1* | 3/2008 | Kim | H01L 51/5012 313/504 |
| 2008/0203406 A1 | 8/2008 | He et al. | |
| 2008/0284318 A1 | 11/2008 | Deaton et al. | |
| 2012/0187827 A1 | 7/2012 | Hunze et al. | |
| 2012/0205632 A1* | 8/2012 | Shitagaki | C09K 11/025 257/40 |
| 2014/0034930 A1* | 2/2014 | Seo | H01L 51/0051 257/40 |
| 2016/0035983 A1 | 2/2016 | Kathirgamanathan | |
| 2016/0163771 A1* | 6/2016 | Jang | H01L 27/3209 257/40 |
| 2016/0164020 A1 | 6/2016 | Kim et al. | |
| 2017/0244042 A1* | 8/2017 | Kwon | H01L 51/0069 |
| 2019/0305229 A1* | 10/2019 | Ihn | H01L 51/5012 |

FOREIGN PATENT DOCUMENTS

| | | |
|---|---|---|
| KR | 1020040093679 | 11/2004 |
| KR | 1020080028212 | 3/2008 |
| KR | 1020090090656 | 8/2009 |

OTHER PUBLICATIONS

Liao, T. et al. "Enhance Efficiency of Blue and White Organic Light Emitting Diodes with Mixed Host Emitting Layer Using TCTA and 3TPYMB." Current Applied Physics 13 (2013) S152-S155. (Year: 2013).*

Su, Shi-Jian et al., "Highly Efficient Organic Blue-and White-Light-Emitting Devices Having a Carrier-and Exciton-Confining Structure for Reduced Efficiency Roll-Off." Advanced Materials, vol. 20, pp. 4189-4194 (2008).

Marina E. Kondakova et al., High-efficiency, low-voltage phosphorescent organic light-emitting diode devices with mixed host, 2008, 18 pages, 104, Journal of Applied Physics.

International Search Report—PCT/KR2013/002980 dated Jul. 14, 2013.

Written Opinion—PCT/KR2013/002980 dated Jul. 14, 2013.

Young-Seo Park et al., "Energy transfer from exciplexes to dopants and its effect on efficiency of organic light-emitting diodes", J. Appl. Phys. 110, 124519-1--124519-6, (2011).

KR Notice of Allowance—KR Application No. 10-2012-0037560 dated Apr. 18, 2014.

* cited by examiner

ORGANIC LIGHT-EMITTING DIODE CONTAINING CO-HOSTS FORMING EXCIPLEX, AND LIGHTING DEVICE AND DISPLAY APPARATUS INCLUDING SAME

CROSS-REFERENCE TO RELATED APPLICATIONS

This application is a continuation of U.S. application Ser. No. 14/391,610, filed on Oct. 9, 2014, which is a 371 International Application of PCT/KR2013/002980, filed on Apr. 10, 2013, which claims priority to Korean Patent Application No. 10-2012-0037560, filed on Apr. 10, 2012, and all the benefits accruing therefrom under 35 U.S.C. § 119, the contents of which in their entirety are herein incorporated by reference.

FIELD

The present disclosure relates to an organic light-emitting diode ("OLED") containing co-hosts forming an exciplex upon excitation, and a lighting device and a display apparatus including the same, and more particularly, to an OLED using exciplex-forming hosts and fluorescent or phosphorescent dopants in a light emitting layer, and a lighting device and a display apparatus including the same. For example, the OLED may be used in an organic light-emitting lighting device and an organic light-emitting display apparatus.

BACKGROUND

Organic light-emitting diodes ("OLEDs") are self light-emitting devices and are advantageous in that they not only have wide viewing angles and excellent contrasts, but also have fast response times and excellent luminance, driving voltage and response rate and enable demonstration of multicolors.

The driving principle of OLEDs is as follows. When a voltage is applied between a cathode and an anode, holes injected from the bottom electrode are moved to a light emitting layer via a hole transport layer, and electrons injected from the cathode are moved to the light emitting layer via an electron transport layer. The holes and electrons (carriers) are recombined in a light emitting layer to form excitons, and light is emitted as the excited molecules transit from an excited state to a ground state.

OLED performance has been greatly improved recently to demonstrate a high external quantum efficiency value of 29% with very low efficiency roll-off. However, large number of OLEDs reported in literature showed high driving voltages compared to theoretical values. One of the reasons why the OLEDs have high driving voltages is related to an injection barrier of electrons and/or holes between the electrodes and organic layer and/or between organic layers.

For the reduction of driving voltages, there have been attempts to lower or remove the energy barriers and to balance the electrons and holes in the emitting layer without electrical loss. Even with such effort, however, light emitting efficiencies are still low with high driving voltage and high efficiency roll-off at high luminance compared to theoretical values.

Since high efficiency OLEDs reported in literature have not reached satisfactory driving voltage and luminous efficiency levels at the same time as described above, various technologies for solving these problems are desired.

SUMMARY

In accordance with an exemplary embodiment of the present disclosure to resolve the above-described issues, there is provided an organic light-emitting diode ("OLED") having an excellent luminous efficiency and a low driving voltage at the same time.

In accordance with another exemplary embodiment of the present disclosure, there is provided a display apparatus including the OLED.

According to an aspect of the present disclosure, there is provided an OLED including a bottom electrode, a top electrode disposed opposite to the bottom electrode, and an organic layer that is interposed between the bottom electrode and the top electrode and includes an exciplex-forming mixed host composed of a hole-transporting material and an electron-transporting material and a phosphorescent dopant having a triplet energy which is lower than the triplet energy of the hole-transporting host, the triplet energy of the electron-transporting host, and the triplet energy of the exciplex.

The hole-transporting host and the electron-transporting host may satisfy the following relational expressions 1 and 2:

$$\text{Lowest unoccupied molecular orbital("LUMO")energy of the hole-transporting host–LUMO energy of the electron-transporting host} > 0.2 \text{ eV} \quad \text{and} \quad (1)$$

$$\text{Highest occupied molecular orbital("HOMO")energy of the hole-transporting host–HOMO energy of the electron-transporting host} > 0.2 \text{ eV}. \quad (2)$$

The organic layer may include a light emitting layer.

The organic layer may include a light emitting layer, a hole transport layer interposed between the light emitting layer and the bottom electrode, and an electron transport layer interposed between the light emitting layer and the top electrode, wherein the hole-transporting host, the electron-transporting host, and the phosphorescent dopant may be included in the light emitting layer.

The hole transport layer may be formed using a hole-transporting material that is the same as the hole-transporting host, and the electron transport layer may be formed using an electron-transporting material that is the same as the electron-transporting host.

The hole-transporting host, the electron-transporting host, and the phosphorescent dopant may be mixed at a molar ratio of 100:(30 to 300):(1 to 100).

The hole-transporting host and the electron-transporting host may be mixed in a combination selected from TCTA:B3PYMPM, TCTA:TPBi, TCTA:3TPYMB, TCTA:BmPyPB, TCTA:BSFM, CBP:B3PYMPM, and NPB:BSFM.

According to another aspect of the present disclosure, there is provided an OLED including a bottom electrode, a top electrode disposed opposite to the bottom electrode, and an organic layer that is interposed between the bottom electrode and the top electrode and includes a hole-transporting host and an electron-transporting host, and a fluorescent dopant, wherein the hole-transporting host and the electron-transporting host form an exciplex upon excitation and in which a difference between a singlet energy and a triplet energy of the exciplex is lower than 0.3 eV, and a fluorescent dopant having a singlet energy which is lower than the singlet energy of the exciplex.

The hole-transporting host and the electron-transporting host may satisfy the following relational expressions 1 and 2:

LUMO energy of the hole-transporting host−LUMO energy of the electron-transporting host>0.2 eV and     (1)

HOMO energy of the hole-transporting host−HOMO energy of the electron-transporting host>0.2 eV.     (2)

The organic layer may include a light emitting layer.

The organic layer may include a light emitting layer, a hole transport layer interposed between the light emitting layer and the bottom electrode, and an electron transport layer interposed between the light emitting layer and the top electrode, wherein the hole-transporting host, the electron-transporting host, and the fluorescent dopant may be included in the light emitting layer.

The hole transport layer may be formed using a hole-transporting material that is the same as the hole-transporting host, and the electron transport layer may be formed using an electron-transporting material that is the same as the electron-transporting host.

The hole-transporting host, the electron-transporting host, and the fluorescent dopant may be mixed at a molar ratio of 100:30 to 300:1 to 100.

The hole-transporting host and the electron-transporting host may be mixed in a combination selected from TCTA:B3PYMPM, TCTA:TPBi, TCTA:3TPYMB, TCTA:BmPyPB, TCTA:BSFM, CBP:B3PYMPM, and NPB:BSFM.

According to another aspect of the present disclosure, there is provided a lighting device including the OLED.

According to another aspect of the present disclosure, there is provided a display apparatus including the OLED.

An organic light-emitting diode (OLED) according to an aspect of the present disclosure has a low driving voltage and a high luminous efficiency and displays high efficiency characteristics at a high luminance by using an exciplex-forming co-host consisting of a hole-transporting host and an electron-transporting host.

A display apparatus or a lighting device according to another aspect of the present disclosure may be used in a field requiring low voltage high efficiency characteristics by including an OLED using an exciplex-forming co-host consisting of a hole-transporting host and an electron-transporting host.

DETAILED DESCRIPTION

Figure 1:
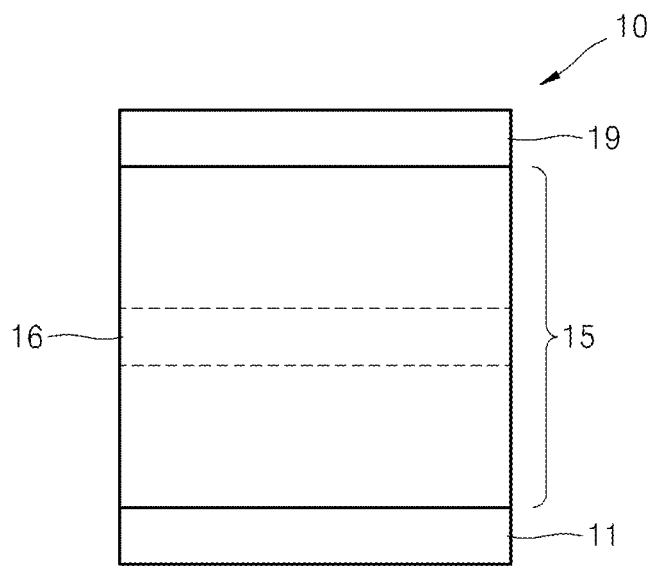
FIG. 1 is a cross-sectional view schematically showing the structure of an organic light-emitting diode ("OLED") according to an exemplary embodiment of the present disclosure.

FIG. 1 is a cross-sectional view schematically illustrating the structure of an organic light-emitting diode ("OLED") 10 according to an exemplary embodiment of the present disclosure.

The OLED 10 according to an exemplary embodiment of the present disclosure includes a bottom electrode 11, a top electrode 19 disposed opposite to the bottom electrode 11, and an organic layer 15 that is interposed between the bottom electrode 11 and the top electrode 19, wherein the organic layer 15 includes an exciplex-forming co-host consisting of a hole-transporting host and an electron-transporting host and a phosphorescent dopant having a triplet energy which is lower than the triplet energy of the hole-transporting host, the triplet energy of the electron-transporting host, and the triplet energy of the exciplex.

The bottom electrode 11 of the OLED 10 may be an anode to which a positive voltage is applied, and the top electrode 19 of the OLED 10 may be a cathode to which a negative voltage is applied. Alternatively, the bottom electrode 11 may be the cathode, and the top electrode 19 may be the anode. A case of the OLED 10 including the bottom electrode 11 as the anode and the top electrode 19 as the cathode is described for convenience.

When a voltage is applied to the bottom electrode 11 and the top electrode 19 of the OLED 10, holes in the organic layer 15 are transported by a hole-transporting host, and electrons in the organic layer 15 are transported by an electron-transporting host such that an exciton is formed in a light emitting layer 16. Since a mixture of a hole-transporting host having hole transport characteristics and an electron-transporting host having electron transport characteristics is used as a host of the light emitting layer 16, a driving voltage is lowered as there is no energy barrier when holes and electrons are injected into the light emitting layer 16.

However, the exciton is not easily formed since the holes and the electrons are not present in the same host material when a hole-transporting host having holes and an electron-transporting host having electrons are brought into contact with each other in the light emitting layer 16. Since the OLED 10 uses as a co-host a hole-transporting host and an electron-transporting host that are capable of being brought into contact with each other to form an exciplex upon excitation, holes on the hole-transporting host and electrons on the electron-transporting host are only physically brought into contact with each other to form the exciplex and the exciplex energy may be transferred to the dopant through energy transfer.

Energy is transferred from the exciplex which is formed between a hole-transporting host and an electron-transporting host in the organic layer 15 to a phosphorescent dopant. Therefore, the triplet energy of the phosphorescent dopant should be lower than the triplet energy of the hole-transporting host, the triplet energy of the electron-transporting host, and the triplet energy of the exciplex in order for the energy transfer to take place.

As a result, when a hole-transporting host having holes and an electron-transporting host having electrons are brought into contact with each other in the organic layer 15, the OLED 10 forms the exciplex, wherein an energy of the formed exciplex is transferred to a phosphorescent dopant such that an exciton may be formed in the phosphorescent dopant, and then recombination of the exciton occurs in the light emitting layer 16 such that light emission may occur.

There are no energy barriers to inject holes and electrons into the emitting layer 16 using a co-host, and the hole-transporting host and the electron-transporting host are brought into contact with each other to form the exciplex in a state that the hole-transporting host and the electron-transporting host do not transfer holes or electrons over an energy barrier there between, or the hole-transporting host and the electron-transporting host do not transfer the holes or electrons to a dopant. Therefore, the OLED 10 has low driving voltage and high luminous efficiency characteristics. When a phosphorescent dopant is used, the OLED 10 may display a high efficiency value with low efficiency roll-off at a high luminance value.

The hole-transporting host and the electron-transporting host may satisfy the following relational expressions 1 and 2:

Lowest unoccupied molecular orbital("LUMO")energy of the hole-transporting host–LUMO energy of the electron-transporting host>0.2 eV and   (1)

Highest occupied molecular orbital("HOMO")energy of the hole-transporting host–HOMO energy of the electron-transporting host>0.2 eV.   (2)

When a difference between the LUMO energy of the hole-transporting host and the LUMO energy of the electron-transporting host is higher than 0.2 eV, an exciplex may be smoothly formed without a process of directly transferring electrons from the electron-transporting host to the hole-transporting host.

Further, when a difference between the HOMO energy of the hole-transporting host and the HOMO energy of the electron-transporting host is higher than 0.2 eV, the exciplex may be smoothly formed without a process of directly transferring holes from the hole-transporting host to the electron-transporting host.

The organic layer 15 of the OLED 10 may include the light emitting layer 16.

The organic layer 15 includes a hole-transporting host and an electron-transporting host, and the light emitting layer 16 includes a hole-transporting host, an electron-transporting host and a phosphorescent dopant.

The hole-transporting host, the electron-transporting host and the phosphorescent dopant may have a mixing molar ratio range of 100:30-300:1-100 in the organic layer 15 of the OLED 10. When the mixing molar ratio range of the hole-transporting host, the electron-transporting host and the phosphorescent dopant satisfies the above range, satisfactory levels of energy transfer and light emission may occur.

For example, the hole-transporting host and the electron-transporting host may be mixed in a combination selected from TCTA:B3PYMPM, TCTA:TPBi, TCTA:3TPYMB, TCTA:BmPyPB, TCTA:BSFM, CBP:B3PYMPM, and NPB:BSFM.

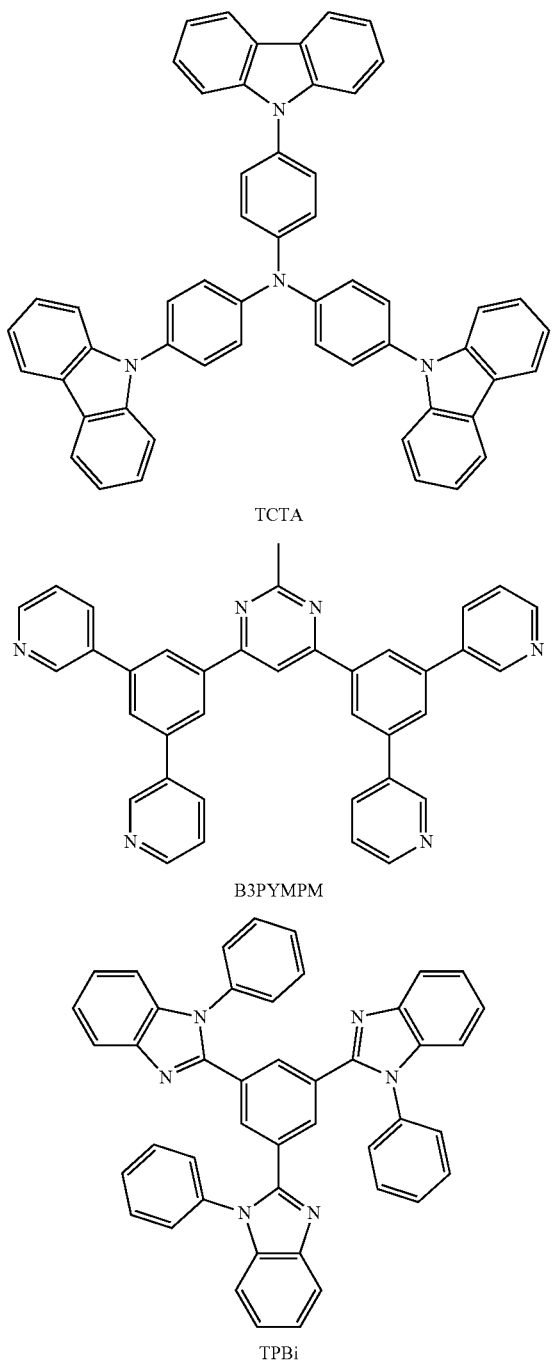

TCTA

B3PYMPM

TPBi

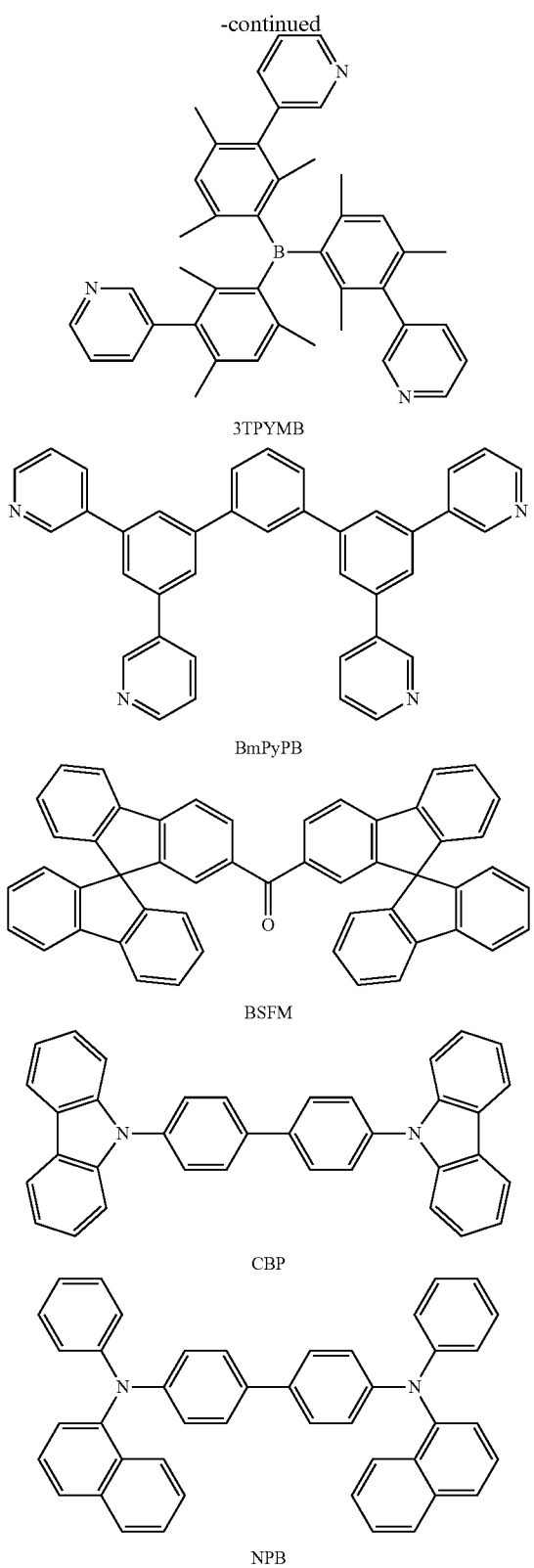

Figure 2:
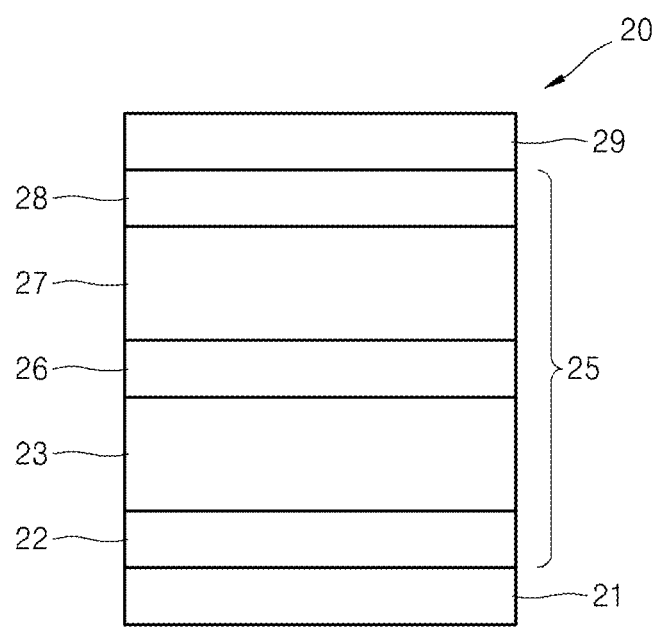
FIG. 2 is a cross-sectional view schematically showing the structure of an OLED according to another exemplary embodiment of the present disclosure.

FIG. 2 is a cross-sectional view schematically illustrating the structure of an OLED 20 according to another exemplary embodiment of the present disclosure.

The OLED 20 according to the another exemplary embodiment of the present disclosure includes: a bottom electrode 21; a top electrode 29 disposed opposite to the bottom electrode 21; and an organic layer 25 that is interposed between the bottom electrode 21 and the top electrode 29, wherein the organic layer 25 includes a light emitting layer 26, a hole transport layer 23 interposed between the light emitting layer 26 and the bottom electrode 21, a hole injection layer 22 interposed between the hole transport layer 23 and the bottom electrode 21, an electron transport layer 27 interposed between the light emitting layer 26 and the top electrode 29, and an electron injection layer 28 interposed between the electron transport layer 27 and the top electrode 29. At least one of the hole injection layer 22 and the electron injection layer 28 may be omitted.

The hole transport layer 23 of the OLED 20 may be formed using a hole-transporting host, the light emitting layer 26 includes a hole-transporting host, an electron-transporting host and a phosphorescent dopant, and the electron transport layer 27 may be formed using an electron-transporting host. The hole-transporting host and the electron-transporting host are a co-host forming an exciplex upon excitation.

That is, the hole transport layer 23 includes a hole-transporting material, wherein the hole-transporting material is the same material as the hole-transporting host, and an electron-transporting material included in the electron transport layer 27 is the same material as the electron-transporting host.

In the OLED 20, the holes are present within the hole-transporting host in the hole transport layer 23 as holes are transported from the bottom electrode 21 to the hole transport layer 23 via the hole injection layer 22, and the electrons are present within the electron-transporting host in the electron transport layer 27 as electrons are transported from the top electrode 29 to the electron transport layer 27 via the electron injection layer 28. When the holes and electrons are transferred to the light emitting layer 26, the holes are moved from the hole-transporting host of the hole transport layer 23 to the hole-transporting host of the light emitting layer 26 such that the holes are transferred to the light emitting layer 26, and the electrons are moved from the electron-transporting host of the electron transport layer 27 to the electron-transporting host of the light emitting layer 26 such that the electrons are transferred to the light emitting layer 26. Therefore, an energy barrier between the hole transport layer 23 and the light emitting layer 26 and an energy barrier between the electron transport layer 27 and the light emitting layer 26 are removed and absent such that a driving voltage is greatly reduced.

After the hole-transporting host and the electron-transporting host are physically brought into contact with each other to form an exciplex in the light emitting layer 26, the exciplex energy is transferred to a phosphorescent dopant to form an exciton. A triplet energy of the phosphorescent dopant may be less than the triplet energy of the hole-transporting host, the triplet energy of the electron-transporting host and the triplet energy of the exciplex in order for the energy transfer to take place efficiently.

The hole-transporting host, the electron-transporting host and the phosphorescent dopant may have a mixing molar ratio range of 100:30-300:1-100 in the light emitting layer 26 of the OLED 20. When the mixing molar ratio range of the hole-transporting host, the electron-transporting host and the phosphorescent dopant satisfies the above range, energy transfer and light emission may occur efficiently.

An OLED according to another exemplary embodiment of the present disclosure may include: a bottom electrode; a top electrode disposed opposite to the bottom electrode; and an organic layer that is interposed between the bottom electrode and the top electrode, the organic layer including a hole-transporting host and an electron-transporting host which form an exciplex upon excitation and in which a difference between a singlet energy of the exciplex and a triplet energy of the exciplex is lower than 0.3 eV, and a fluorescent dopant having a singlet energy which is lower than the singlet energy of the exciplex.

The bottom electrode of the OLED may be an anode to which a positive voltage is applied, and the top electrode of the OLED may be a cathode to which a negative voltage is applied. Alternatively, the bottom electrode may be the cathode, and the top electrode may be the anode. A case of the OLED including the bottom electrode as the anode and the top electrode as the cathode is described for convenience.

When a voltage is applied to the bottom electrode and the top electrode of the OLED, holes in the organic layer are transported by a hole-transporting host, and electrons in the organic layer are transported by an electron-transporting host such that an exciton is formed in a light emitting layer. Since a mixture of a hole-transporting host having hole transport characteristics and an electron-transporting host having electron transport characteristics is used as a host of the light emitting layer, a driving voltage is lowered as there is no energy barrier when holes and electrons are injected into the light emitting layer.

The OLED uses as a co-host a hole-transporting host and an electron-transporting host that are capable of being brought into contact with each other to form an exciplex upon excitation. The exciplex in the organic layer are present in the singlet and in the triplet states with a ratio of 1:3.

Since the difference between the singlet energy of the exciplex and the triplet energy of the exciplex is less than 0.3 eV in the OLED, reversible intersystem crossing is possible such that the triplet state can be reversed into the singlet state. Therefore, most exciplexes in the organic layer may be present in a state that they are crossed into the singlet state. Furthermore, since a singlet energy of a fluorescent dopant is lower than the singlet energy of the exciplex, the exciplexes of the singlet state that are present in the organic layer smoothly transfer energy to the dopant such that an exciton may be formed. As a result, an internal quantum efficiency of the OLED may be very high using a fluorescent dopant.

There are no energy barriers to inject holes and electrons into emitting layer using co-host, and the hole-transporting host and the electron-transporting host are brought into contact with each other to form an exciplex such that an energy of singlet exciplex is transferred to the fluorescent dopant. Therefore, such an OLED may have a low driving voltage, a high luminous efficiency and a very high internal quantum efficiency.

The hole-transporting host and the electron-transporting host may satisfy the following relational expressions 1 and 2:

LUMO energy of the hole-transporting host−LUMO energy of the electron-transporting host>0.2 eV and  (1)

HOMO energy of the hole-transporting host−HOMO energy of the electron-transporting host>0.2 eV.  (2)

When a difference between the LUMO energy of the hole-transporting host and the LUMO energy of the electron-transporting host is higher than 0.2 eV, an exciplex may be formed without a process of directly transferring electrons from the electron-transporting host to the hole-transporting host.

Further, when a difference between the HOMO energy of the hole-transporting host and the HOMO energy of the electron-transporting host is higher than 0.2 eV, the exciplex may be formed without a process of directly transferring holes from the hole-transporting host to the electron-transporting host.

An organic layer of the OLED may include a light emitting layer. The organic layer includes a hole-transporting host and an electron-transporting host, and the light emitting layer includes a hole-transporting host, an electron-transporting host and a fluorescent dopant.

The hole-transporting host, the electron-transporting host and the fluorescent dopant may have a mixing molar ratio range of 100:30-300:1-100 in the organic layer of the OLED. When the mixing molar ratio range of the hole-transporting host, the electron-transporting host and the fluorescent dopant satisfies the above range, efficient energy transfer and light emission may occur.

For example, the hole-transporting host and the electron-transporting host may be mixed in a combination selected from TCTA:B3PYMPM, TCTA:TPBi, TCTA:3TPYMB, TCTA:BmPyPB, TCTA:BSFM, CBP:B3PYMPM, and NPB:BSFM.

An OLED according to another exemplary embodiment of the present disclosure includes: a bottom electrode; a top electrode disposed opposite to the bottom electrode; and an organic layer that is interposed between the bottom electrode and the top electrode, wherein the organic layer includes a light emitting layer, a hole transport layer interposed between the light emitting layer and the bottom electrode, a hole injection layer interposed between the hole transport layer and the bottom electrode, an electron transport layer interposed between the light emitting layer and the top electrode, and an electron injection layer interposed between the electron transport layer and the top electrode. At least one of the hole injection layer and the electron injection layer may be omitted.

The hole transport layer of the OLED may be formed using a hole-transporting material, wherein the hole-transporting material is the same material as the hole-transporting host, and an electron-transporting material in the electron transport layer may be the same material as the electron-transporting host.

In the OLED, the holes are present within the hole-transporting host in the hole transport layer as holes are transported from the bottom electrode to the hole transport layer via the hole injection layer, and the electrons are present within the electron-transporting host in the electron transport layer as electrons are transported from the top electrode to the electron transport layer via the electron injection layer. When transferring the holes and electrons to the light emitting layer, the holes are moved from the hole transport layer to the hole-transporting host of the light emitting layer such that the holes are transferred to the light emitting layer, and the electrons are moved from the electron transport layer to the electron-transporting host of the light emitting layer such that the electrons are transferred to the light emitting layer. Therefore, an energy barrier between the hole transport layer and the light emitting layer and an energy barrier between the electron transport layer and the light emitting layer are removed such that a driving voltage is greatly reduced.

A hole-transporting host and an electron-transporting host are physically brought into contact with each other in a light emitting layer to form an exciplex and transfer the exciplex energy to a fluorescent dopant. The exciplex is present in a singlet state since a difference between the singlet energy of the exciplex and the triplet energy of the exciplex is less than 0.3 eV, and the energy of singlet exciplex is transferred to the fluorescent dopant since a singlet energy of the fluorescent dopant is less than the singlet energy of the exciplex.

The hole-transporting host, the electron-transporting host and the fluorescent dopant may have a mixing molar ratio range of 100:30-300:1-100 in the light emitting layer of the OLED. When the mixing molar ratio range of the hole-transporting host, the electron-transporting host and the fluorescent dopant satisfies the above range, efficient energy transfer and light emission may occur.

Hereinafter, a method of manufacturing an OLED according to an exemplary embodiment of the present disclosure is described in detail by referring to FIG. 2. However, the exemplary embodiment of the present disclosure is not limited thereto.

Examples of a substrate (which is not drawn in the drawing) may include substrates used in OLEDs of the related art, and a glass substrate or a transparent plastic substrate that is excellent in terms of mechanical strength, thermal stability, transparency, surface flatness, handling ability, and waterproofing property. For example, a substrate may be formed of a transparent glass material including $SiO_2$ as a principle component.

A bottom electrode 21 is formed on the substrate. The bottom electrode 21 may be formed as a transparent electrode or a reflection electrode, and the bottom electrode 21 may be formed as the transparent electrode if an OLED is a bottom emitting type. When forming the bottom electrode 21 as the transparent electrode, indium tin oxide (ITO), indium zinc oxide (IZO), zinc oxide (ZnO), graphene, etc may be used. When forming the bottom electrode 21 as the reflection electrode, after a reflection film is formed of silver (Ag), magnesium (Mg), aluminium (Al), platinum (Pt), palladium (Pd), gold (Au), nickel (Ni), neodymium (Nd), iridium (Ir), chromium (Cr), or compounds thereof, a film is formed on the reflection film using ITO, IZO, ZnO, graphene, etc. such that the reflection electrode may be formed. The bottom electrode 21 may be formed by various well-known methods such as deposition, sputtering, spin-coating, etc.

A hole injection layer 22 is formed on the bottom electrode 21. The hole injection layer 22 may be formed on the top of the bottom electrode 21 by various methods such as vacuum deposition, spin-coating, casting, a Langmuir-Blodgett (LB) method, etc. Well-known hole injection materials may be used as material used in the hole injection layer 22. Examples of the material used in the hole injection layer 22 may include: a phthalocyanine compound such as copper phthalocyanine; m-MTDATA; TDATA; TAPC, 2-TNATA; Pani/DBSA (polyaniline/dodecylbenzenesulfonic acid), PEDOT/PSS (poly(3,4-ethylenedioxythiophene)/poly(4-styrenesulfonate)), Pani/CSA (polyaniline/camphorsulfonic acid), Pani/PSS (polyaniline/poly(4-styrenesulfonate)), etc. However, the material used in the hole injection layer 22 is not limited to the examples.

A hole transport layer 23 is formed on the hole injection layer 22. The hole transport layer 23 may be formed by various methods such as vacuum deposition, spin-coating, casting, a LB method, etc. The above-described hole-transporting host may be used as the material that forms the hole transport layer 23.

A light emitting layer 26 is formed on the hole transport layer 23. The light emitting layer 26 may be formed by various methods such as vacuum deposition, spin-coating, casting, a LB method, etc.

The light emitting layer 26 includes a hole-transporting host, an electron-transporting host, and a phosphorescent or fluorescent dopant. For example, the hole-transporting host and the electron-transporting host may be mixed in a combination selected from TCTA:B3PYMPM, TCTA:TPBi, TCTA:3TPYMB, TCTA:BmPyPB, TCTA:BSFM, CBP:B3PYMPM, and NPB:BSFM.

Examples of the phosphorescent dopant may include Ir(ppy), Ir(ppy)$_2$(acac) or PtOEP, but is not limited thereto. Examples of the fluorescent dopant may include a fused-ring aromatic compound such as rubrene, coumarin such as DMQA or C545T, or di-pyran such as DCJTB or DCM, but is not limited thereto.

The hole-transporting host, the electron-transporting host and the phosphorescent dopant (or fluorescent dopant) may be contained in the light emitting layer 26 in amounts selected from a mixing molar ratio range of 100:30-300:1-100.

An electron transport layer 27 is formed on the light emitting layer 26. The electron transport layer 27 may be formed by various methods such as vacuum deposition, spin-coating, casting, a LB method, etc. The above-described electron-transporting host may be used as the material that forms the electron transport layer 27.

An electron injection layer 28 having a function of facilitating injection of electrons from the top electrode 29 is formed on the electron transport layer 27. The electron injection layer 28 may be formed by various methods such as vacuum deposition, spin-coating, casting, a LB method, etc. Materials such as LiF, NaCl, CsF, $Li_2O$, BaO, etc. may be used as a material that forms the electron injection layer 28.

A top electrode 29 is formed on the electron injection layer 28. The top electrode 29 may be formed in a structure including: an alkali metal such as lithium, sodium, potassium, rubidium, cesium, etc.; an alkali earth metal such as beryllium, magnesium, calcium, strontium, barium, etc.; a metal such as aluminum, scandium, vanadium, zinc, yttrium, indium, cerium, samarium, europium, terbium, ytterbium, etc.; an alloy of two or more thereof; or alloy of one or more thereof and one or more of gold, silver, platinum, copper, manganese, titanium, cobalt, nickel, tungsten and tin; and one or more thereof. The structure may be a single layer or a stacked layer. If it is necessary, ITO treated by ultraviolet rays and ozone may be used. Also, the top electrode 29 may use IZO, ZnO, or graphene. If the OLED is a top-emission OLED, the top electrode 29 may be formed of a transparent oxide such as ITO, IZO, ZnO, or graphene. The top electrode 29 may be formed by various well-known methods such as deposition, sputtering, spin-coating, etc.

A lighting device including the OLED according to another exemplary embodiment of the present disclosure is provided. The lighting device includes an OLED including a hole-transporting host and an electron-transporting host that form an exciplex, and a phosphorescent or fluorescent dopant.

A display apparatus including the OLED according to another exemplary embodiment of the present disclosure is provided. The display apparatus includes: a transistor including a source, a drain, a gate and an activation layer; and an OLED including a hole-transporting host and an electron-transporting host that form an exciplex upon excitation, and a phosphorescent or fluorescent dopant. A bottom electrode of the OLED may be electrically connected to the source or the drain.

Hereinafter, an OLED according to an exemplary embodiment of the present disclosure is described in more detail through unlimited Reference Examples and Examples. However, the following Reference Examples and Examples are only for exemplifying the present disclosure, and a scope of the present disclosure is not limited by the following Reference Examples and Examples.

Reference Example 1

Figure 3A:
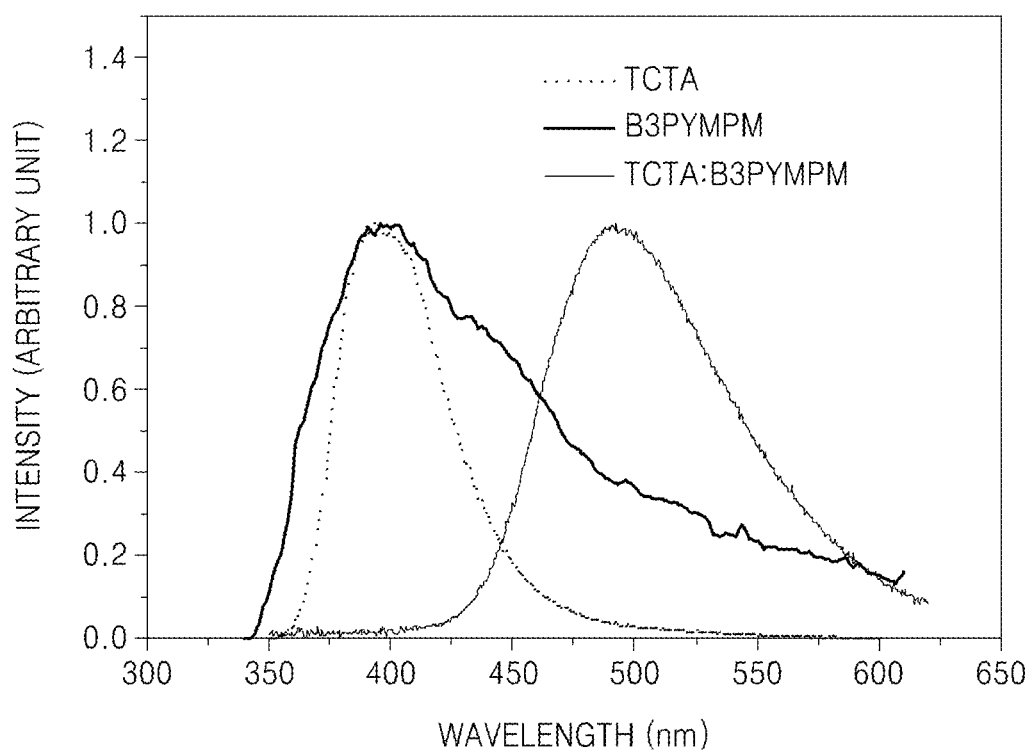
FIGS. 3A and 3B are photoluminescence spectra of thin films described in Reference Example 1 and Comparative Reference Example 1, respectively.

A 4,4',4"-tris(carbazol-9-yl)-triphenylamine (TCTA) thin film, a 4,6-bis(3,5-di(pyridin-3-yl)phenyl)-2-methylpyrimidine (B3PYMPM) thin film, and a thin film in which TCTA and B3PYMPM were mixed at a molar ratio of 1:1 were manufactured. Photoluminescence spectra of the three thin films were measured using a He:Cd laser and a photomultiplier tube (Acton Research Corporation; PD-471) to which a monochromator (Acton Research Corporation; SpectraPro 300i) was attached. The measured photoluminescence spectra are illustrated in FIG. 3A.

Comparative Reference Example 1

Figure 3B:
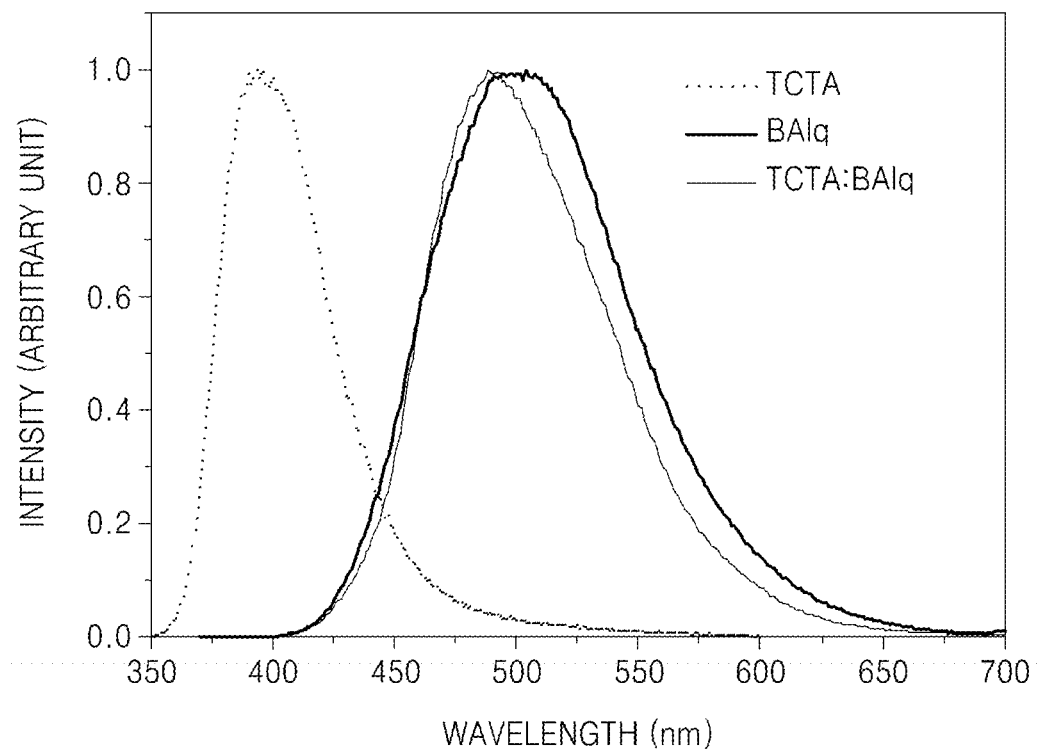

A 4,4',4"-tris(carbazol-9-yl)-triphenylamine (TCTA) thin film, a 1,1'-biphenyl-4'-oxy)-bis(8-hydroxy-2-methylquinolinato)aluminum (BAlq) thin film, and a thin film in which TCTA and BAlq were mixed at a molar ratio of 1:1 were manufactured. Photoluminescence spectra of the three thin films were measured using a He:Cd laser and a photomultiplier tube (Acton Research Corporation; PD-471) to which a monochromator (Acton Research Corporation; SpectraPro 300i) was attached. The measured photoluminescence spectra are illustrated in FIG. 3B.

Reference Example 2

Figure 4A:
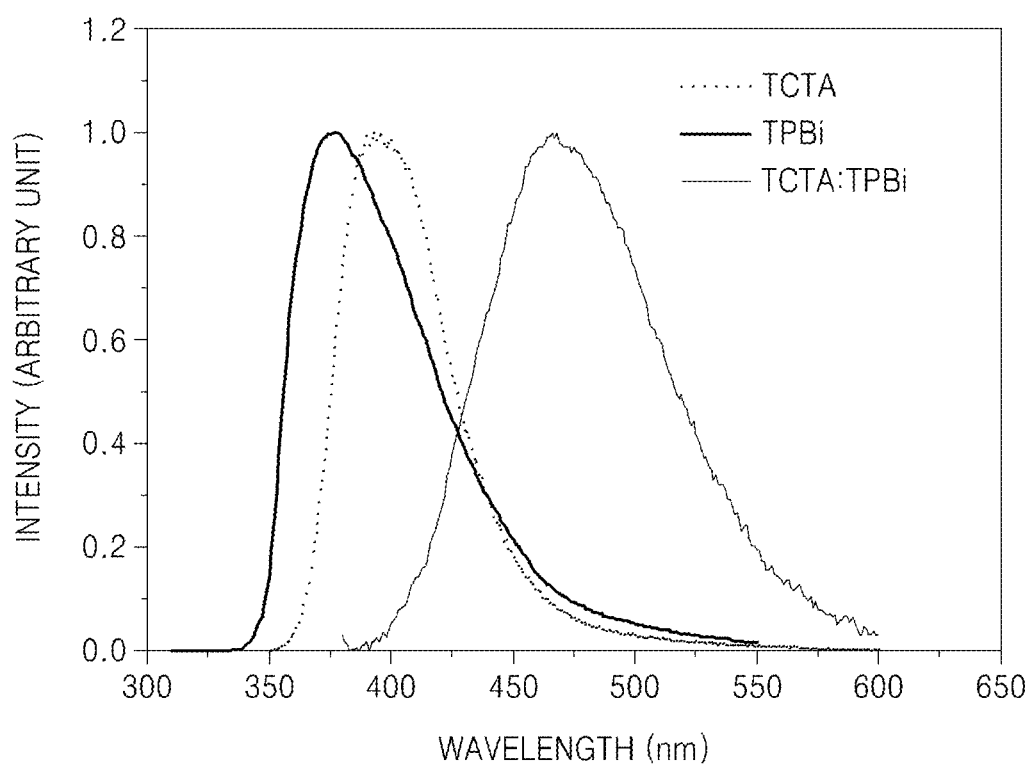
FIGS. 4A to 4F are photoluminescence spectra of thin films described in Reference Examples 2 to 6.

A 4,4',4"-tris(carbazol-9-yl)-triphenylamine (TCTA) thin film, a 1,3,5-tris(N-phenylbenzimidazole-2-yl)benzene (TPBi) thin film, and a thin film in which TCTA and TPBi were mixed at a molar ratio of 1:1 were manufactured. Photoluminescence spectra of the three thin films were measured using a He:Cd laser and a photomultiplier tube (Acton Research Corporation; PD-471) to which a monochromator (Acton Research Corporation; SpectraPro 300i) was attached. The measured photoluminescence spectra are illustrated in FIG. 4A.

Reference Example 3

Figure 4B:
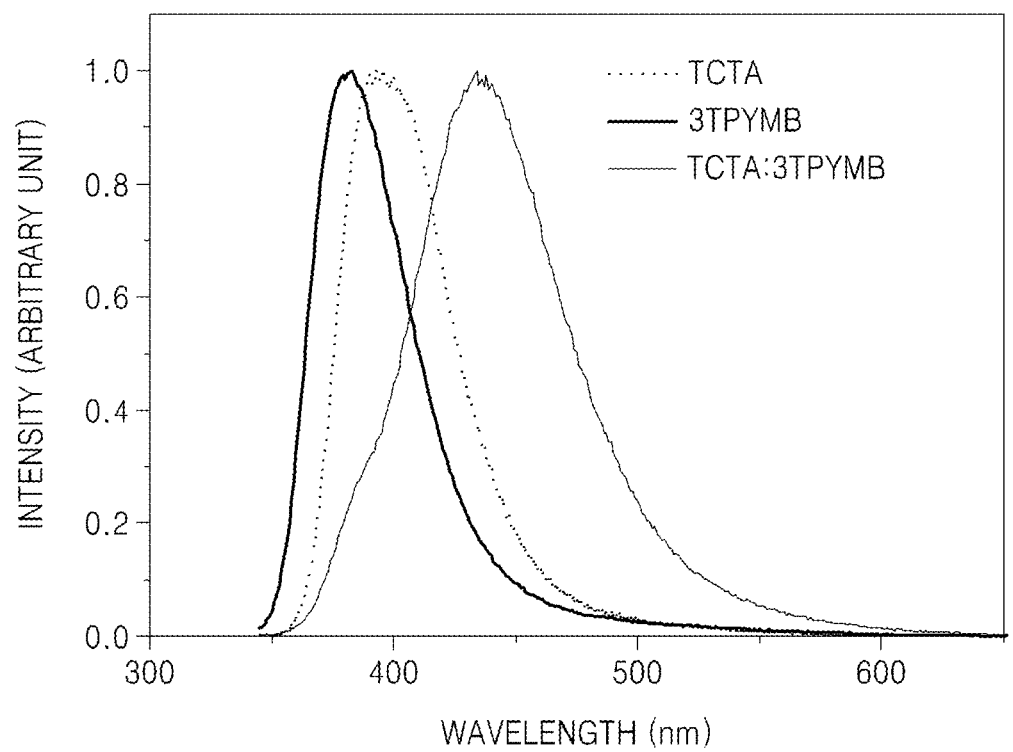

A 4,4',4"-tris(carbazol-9-yl)-triphenylamine (TCTA) thin film, a tris(2,4,6-trimethyl-3-(pyridin-3-yl)phenyl)borane (3TPYMB) thin film, and a thin film in which TCTA and 3TPYMB were mixed at a molar ratio of 1:1 were manufactured. Photoluminescence spectra of the three thin films were measured using a He:Cd laser and a photomultiplier tube (Acton Research Corporation; PD-471) to which a monochromator (Acton Research Corporation; SpectraPro 300i) was attached. The measured photoluminescence spectra are illustrated in FIG. 4B.

Reference Example 4

Figure 4C:
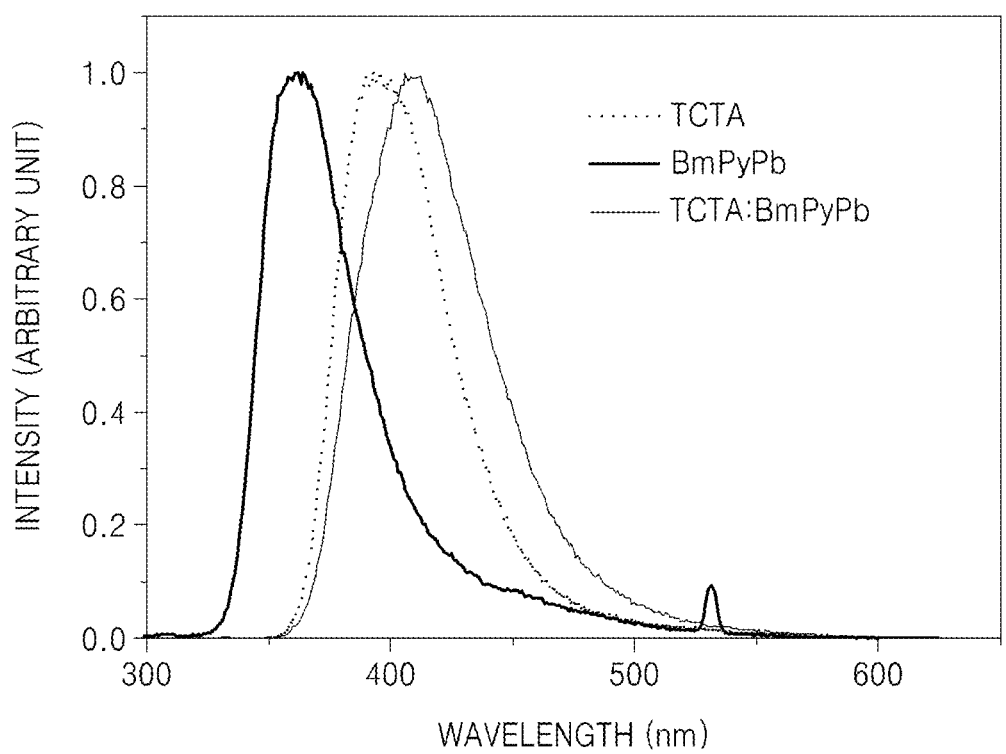

A 4,4',4"-tris(carbazol-9-yl)-triphenylamine (TCTA) thin film, a 1,3-bis(3,5-dipyrid-3-yl-phenyl)benzene (BmPyPB) thin film, and a thin film in which TCTA and BmPyPB were mixed at a molar ratio of 1:1 were manufactured. Photoluminescence spectra of the three thin films were measured using a He:Cd laser and a photomultiplier tube (Acton Research Corporation; PD-471) to which a monochromator (Acton Research Corporation; SpectraPro 300i) was attached. The measured photoluminescence spectra are illustrated in FIG. 4C.

Reference Example 5

Figure 4D:
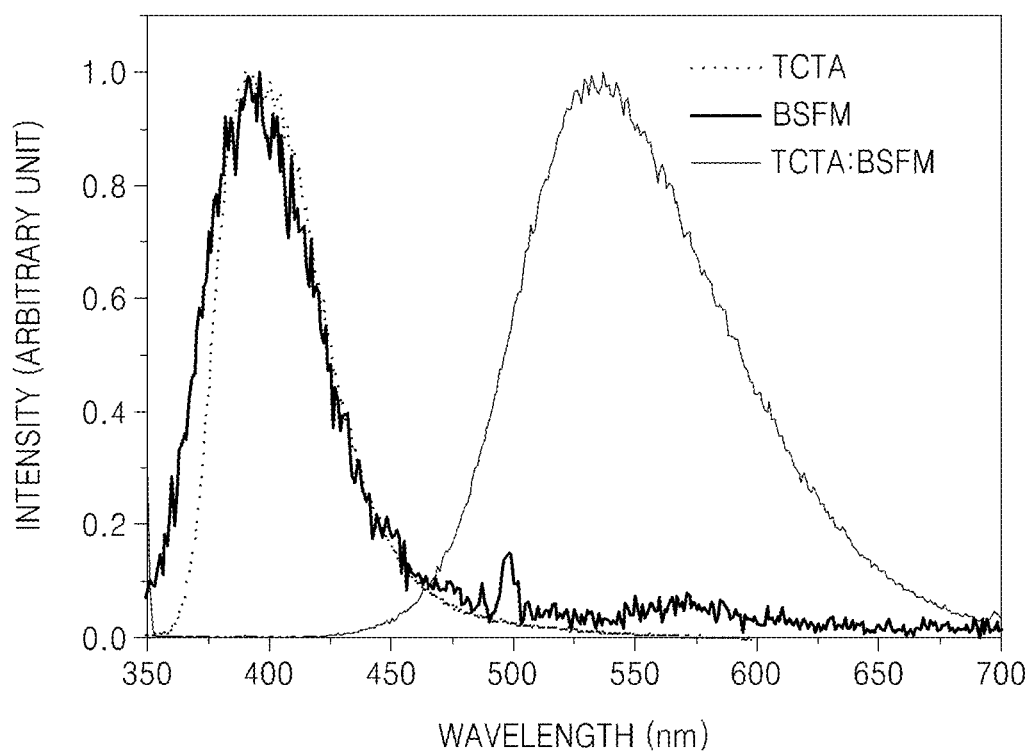

A 4,4',4"-tris(carbazol-9-yl)-triphenylamine (TCTA) thin film, a bis-9,9'-spirobi[fluoren-2-yl]-methanone (BSFM) thin film, and a thin film in which TCTA and BSFM were mixed at a molar ratio of 1:1 were manufactured. Photoluminescence spectra of the three thin films were measured using a He:Cd laser and a photomultiplier tube (Acton Research Corporation; PD-471) to which a monochromator (Acton Research Corporation; SpectraPro 300i) was attached. The measured photoluminescence spectra are illustrated in FIG. 4D.

Reference Example 6

Figure 4E:
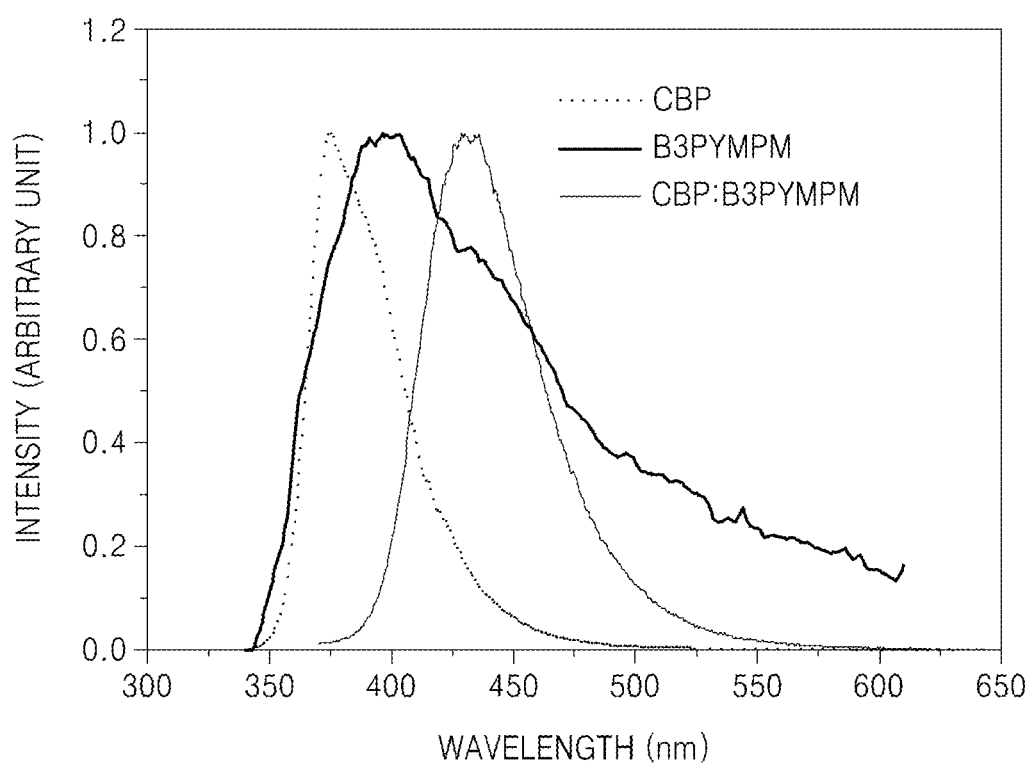

A 4-4'-bis(carbazol-9-yl)biphenyl (CBP) thin film, a 4,6-bis(3,5-di(pyridin-3-yl)phenyl)-2-methylpyrimidine (B3PYMPM) thin film, and a thin film in which CBP and B3PYMPM were mixed at a molar ratio of 1:1 were manufactured. Photoluminescence spectra of the three thin films were measured using a He:Cd laser and a photomultiplier tube (Acton Research Corporation; PD-471) to which a monochromator (Acton Research Corporation; SpectraPro 300i) was attached. The measured photoluminescence spectra are illustrated in FIG. 4E.

Reference Example 7

Figure 4F:
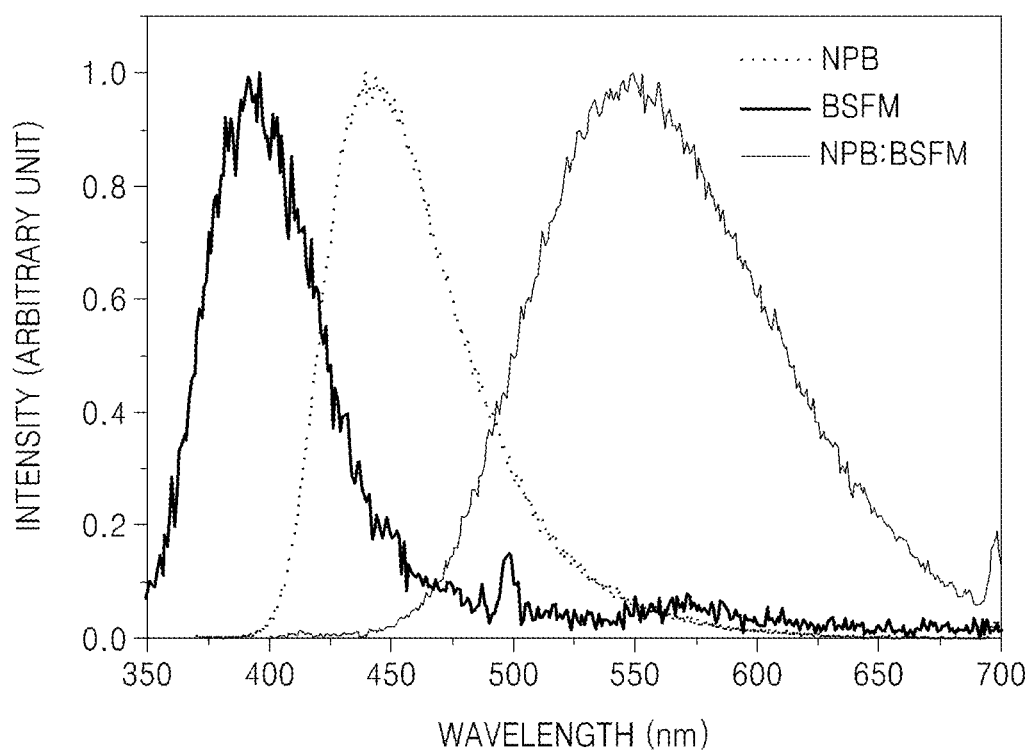

A N,N'-diphenyl-N,N'-bis(1-naphthylphenyl)-1,1'-biphenyl-4,4'-diamine (NPB) thin film, a bis-9,9'-spirobi[fluoren-2-yl]-methanone (BSFM) thin film, and a thin film in which NPB and BSFM were mixed at a molar ratio of 1:1 were manufactured. Photoluminescence spectra of the three thin films were measured using a He:Cd laser and a photomultiplier tube (Acton Research Corporation; PD-471) to which a monochromator (Acton Research Corporation; SpectraPro 300i) was attached. The measured photoluminescence spectra are illustrated in FIG. 4F.

Evaluation Example

Referring to FIG. 3A, it can be seen from the thin films according to the Reference Example 1 that a photoluminescence spectrum of TCTA:B3PYMPM co-host thin film shows light emission of a long wavelength range that is not shown in the photoluminescence spectra of pristine TCTA and B3PYMPM thin films. It may be seen from this that TCTA and B3PYMPM are brought into contact with each other to form an exciplex upon photo-excitation in the thin film in which TCTA and B3PYMPM were mixed.

Referring to FIG. 3B, it can be seen from the thin films according to the Comparative Reference Example 1 that a photoluminescence spectrum of TCTA:Balq co-host thin film was similar with a photoluminescence spectrum of a BAlq thin film. It may be seen from this that an exciplex is not formed in the TCTA:BAlq co-host thin film in which TCTA and BAlq were mixed although TCTA and BAlq are brought into contact with each other.

Referring to FIGS. 4A to 4F, it can be seen from the photoluminescence spectra of the co-host thin films according to the Reference Examples 2 to 7 that the light emission of a long wavelength range that is not shown in a photoluminescence spectrum of a single host thin film which is component of co-host thin film. It may be seen from this that a hole-transporting host material and an electron-transporting host material are mixed to form an exciplex upon photo-excitation in the thin films in which components according to the respective Reference Examples 2 to 7 were mixed.

Example 1

An OLED having the following composition was manufactured:
ITO/TAPC/TCTA/TCTA:B3PYMPM:Ir(ppy)$_2$(acac)/B3PYMPM/LiF/Al A 1,500 Å thick ITO glass substrate in which an ITO film was formed on a glass substrate was used as a bottom electrode, TAPC was deposited on the top of the ITO glass substrate to form a 200 Å thick hole injection layer.

TCTA was deposited on the top of the hole injection layer to form a 100 Å thick hole transport layer.

TCTA, B3PYMPM and Ir(ppy)$_2$(acac) were simultaneously deposited on the top of the hole transport layer at a molar ratio of 100:100:21 to form a 300 Å thick light emitting layer.

B3PYMPM was deposited on the top of the light emitting layer to form a 400 Å thick electron transport layer.

After LiF was deposited on the top of the electron transport layer to form a 10 Å thick electron injection layer, Al was deposited on the electron injection layer to form a 1,000 Å thick top electrode such that an OLED was manufactured.

Example 2

An OLED having the following composition was manufactured using the same method as in the Example 1 except that a 700 Å thick ITO glass substrate was used as the bottom electrode, and TAPC was deposited on the top of the ITO glass substrate to form a 60 Å thick hole injection layer:
ITO/TAPC/TCTA/TCTA:B3PYMPM:Ir(ppy)$_2$(acac)/B3PYMPM/LiF/Al Comparative Example 1

An OLED having the following composition was manufactured using the same method as in the Example 1 except that TCTA, BAlq and Ir(ppy)$_2$(acac) were simultaneously deposited on the top of the hole transport layer at a molar ratio of 100:100:21 to form a 300 Å thick light emitting layer, and BAlq was deposited on the top of the light emitting layer to form a 400 Å thick electron transport layer:
ITO/TAPC/TCTA/TCTA:BAlq:Ir(ppy)$_2$(acac)/BAlq/LiF/Al Comparative Example 2

An OLED having the following composition was manufactured using the same method as in the Example 1 except that TCTA, BAlq and Ir(dmpq)$_2$(acac) were simultaneously deposited on the top of the hole transport layer at a molar ratio of 100:100:6 to form a 300 Å thick light emitting layer, and BAlq was deposited on the top of the light emitting layer to form a 400 Å thick electron transport layer:
ITO/TAPC/TCTA/TCTA:BAlq:Ir(dmpq)$_2$(acac)/BAlq/LiF/Al Evaluation Example Highest occupied molecular orbital ("HOMO") energies and lowest unoccupied molecular orbital ("LUMO") energies for respective layers composing an OLED according to the Example 1 were shown in FIG. 5.

Figure 5:
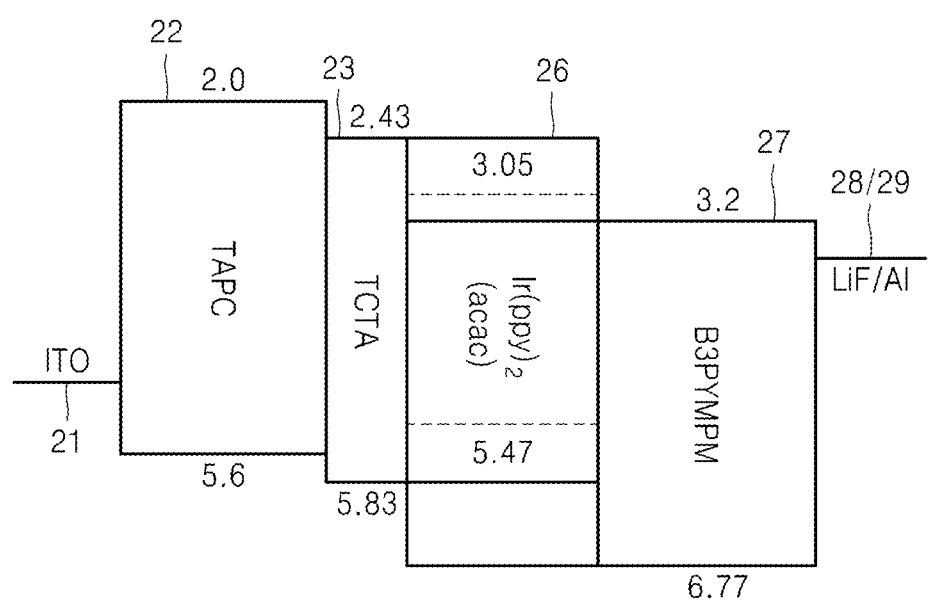
FIG. 5 is a highest occupied molecular orbital ("HOMO") and lowest unoccupied molecular orbital ("LUMO") energy diagram for respective layers of an OLED explained in Example 1.

Referring to FIG. 5, it can be seen that the LUMO energy of TCTA, a hole-transporting host, is about 0.77 eV higher than that of B3PYMPM, an electron-transporting host, and the HOMO energy of TCTA is about 0.94 eV higher than that of B3PYMPM. This shows that an exciplex may be efficiently formed without a process of directly transferring electrons from the electron-transporting host to the hole-transporting host, or directly transferring holes from the hole-transporting host to the electron-transporting host.

On the other hand, the LUMO energy and the HOMO energy of BAlq are known to be 2.9 eV and 5.9 eV respectively. This shows that it is difficult to form an exciplex since an HOMO energy difference between TCTA and BAlq is about 0.07 eV in the light emitting layer of the OLED of the Comparative Example 1.

Triplet energies of hole-transporting hosts, electron-transporting hosts, exciplexes and dopant materials respectively composing the light emitting layers of the OLEDs according to the Example 1 and Comparative Examples 1 and 2 are represented in the following Table 1, wherein the exciplexes were formed by mixing hole-transporting hosts and electron-transporting hosts with each other, and the triplet energies were obtained by calculating energies of lights having wavelengths corresponding to the photoluminescence spectra after measuring photoluminescence spectra using a charge-coupled device (Princeton Instruments; 7393-0005) to which an ND:YAG laser and a spectroscope (Acton Research Corporation; SpectraPro 2300i) were attached in a state that respective thin films were put into a cryostat and maintained at a temperature of 35K.

TABLE 1

Triplet energies of hole-transporting hosts, electron-transporting hosts, exciplexes and dopant materials

| Classification | Hole-transporting host | Electron-transporting host | Exciplex | Dopant |
|---|---|---|---|---|
| Example 1 | TAPC | B3PYMPM | TAPC-B3PYMPM | Ir(ppy)$_2$(acac) |
| | 2.8 eV | 2.75 eV | 2.51 eV | 2.37 eV |
| Comparative Example 1 | TCTA | BAlq | — | Ir(ppy)$_2$(acac) |
| | 2.8 eV | 2.2 eV | — | 2.37 eV |
| Comparative Example 2 | TCTA | BAlq | — | Ir(dmpq)$_2$(acac) |
| | 2.8 eV | 2.2 eV | — | 2.01 eV |

Referring to the Table 1, it can be seen that the triplet energy of the dopants are lower than the triplet energy of the hole-transporting host, the triplet energy of the electron-transporting hosts, and the triplet energy of the exciplex in the OLED according to the Example 1. It indicates that energy transfer from an exciplex formed in the light emitting layer to a phosphorescent dopant is possible in an OLED of Example 1. Meanwhile, it can be seen that the OLED of the Comparative Example 1 does not form an exciplex, the triplet energy of the dopant is higher than the triplet energy of the electron-transporting host, and the OLED of the Comparative Example 2 does not form an exciplex.

Figure 6A:
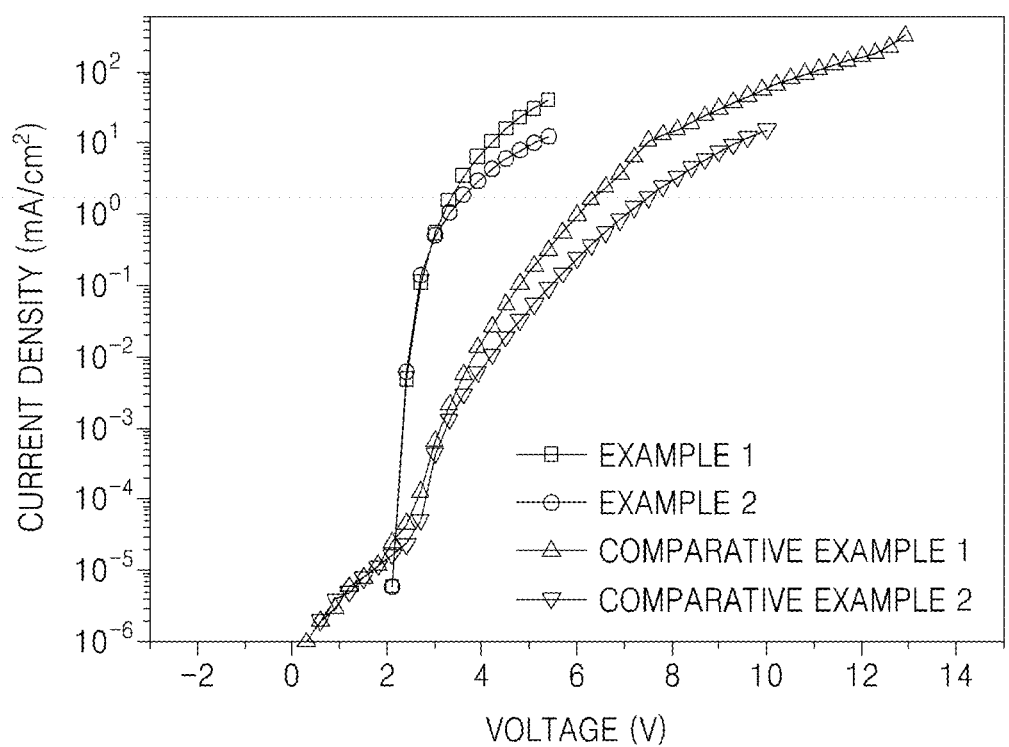
FIG. 6A is a graph showing current density-voltage relations of OLEDs according to Examples 1 to 2 and Comparative Examples 1 to 2.
Figure 6B:
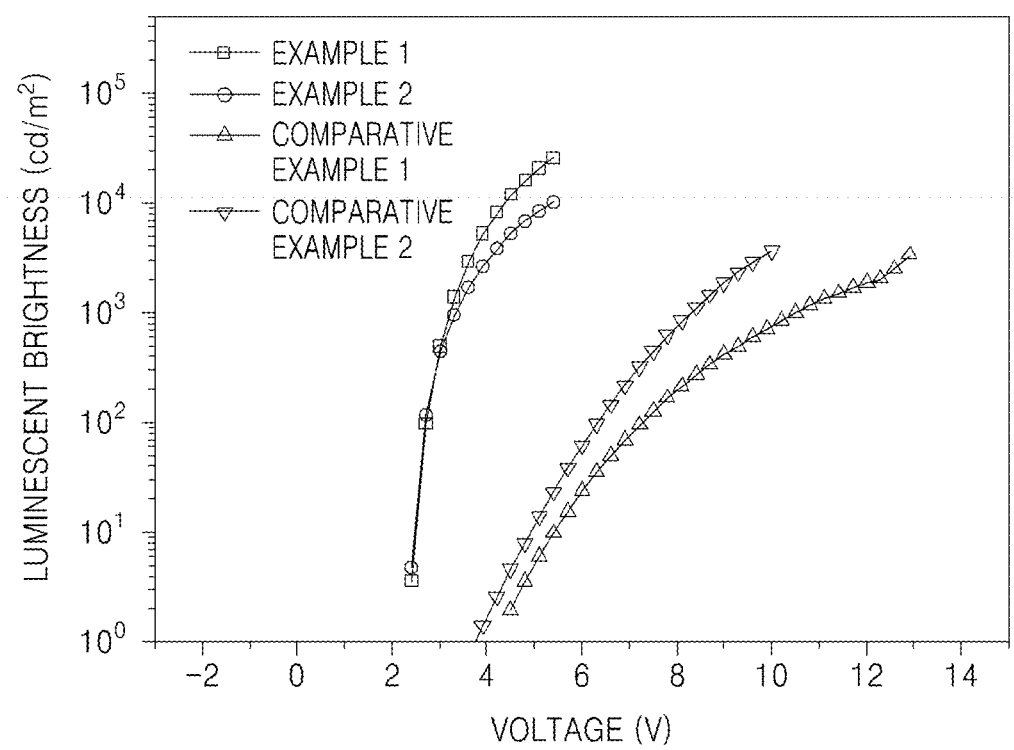
FIG. 6B is a graph showing voltage-luminance relations of OLEDs according to Examples 1 to 2 and Comparative Examples 1 to 2.

FIGS. 6A and 6B showed the current density-voltage-luminance characteristics of the OLEDs according to the Examples 1 to 2 and the Comparative Examples 1 to 2 which were measured using a spectrophotometer (Photo research spectrophotometer; PR-650) and a power supplier (Keithley 2400).

Referring to FIG. 6A, it can be seen that the OLEDs according to the Examples 1 to 2 exhibit the lowest theoretical driving voltages by showing an turn-on voltage of about 2.4 V, a voltage corresponding to an energy gap that is almost the same as the photon energy of emitted green light divided by the elementary charge. Meanwhile, it can be seen that the OLEDs according to the Comparative Examples 1 to 2 respectively exhibit the turn-on voltages of about 4.5 V and about 3.6 V, respectively. This shows that the OLEDs according to the Examples 1 to 2 which form the exciplexes have lower driving voltages than the OLEDs according to the Comparative Examples 1 to 2 which do not form the exciplexes.

Referring to FIG. 6B, it can be seen that the OLEDs according to the Examples 1 to 2 have higher luminance values than the OLEDs according to the Comparative Examples 1 to 2.

Figure 7A:
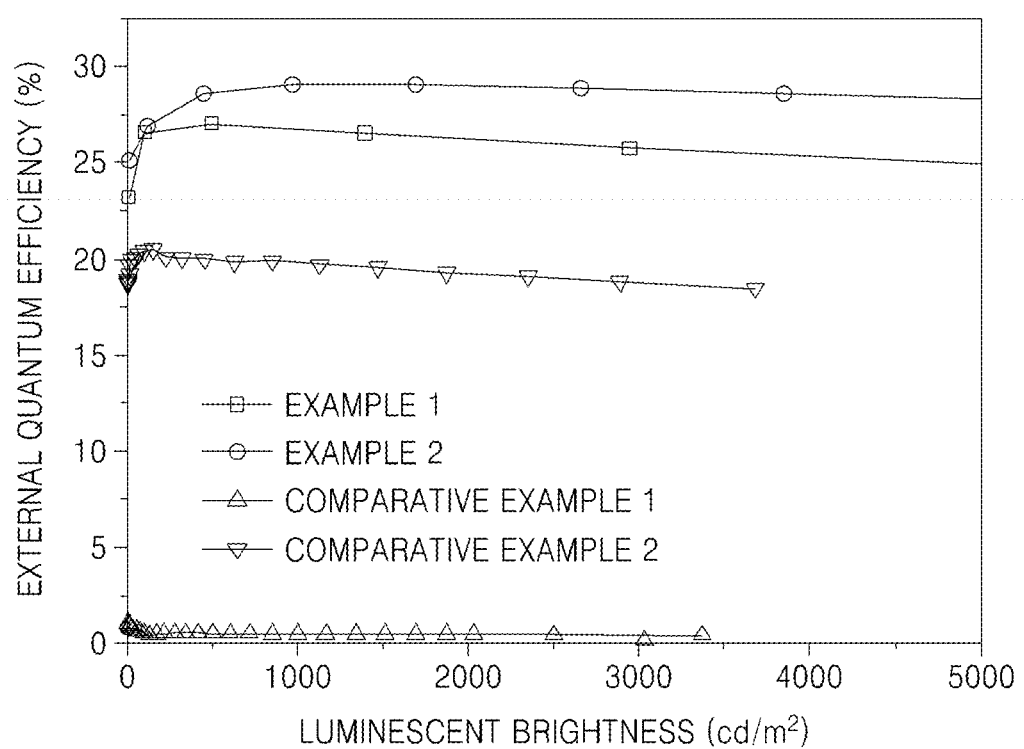
FIG. 7A is a graph showing external quantum efficiency values of OLEDs described in Examples 1 to 2 and Comparative Examples 1 to 2.
Figure 7B:
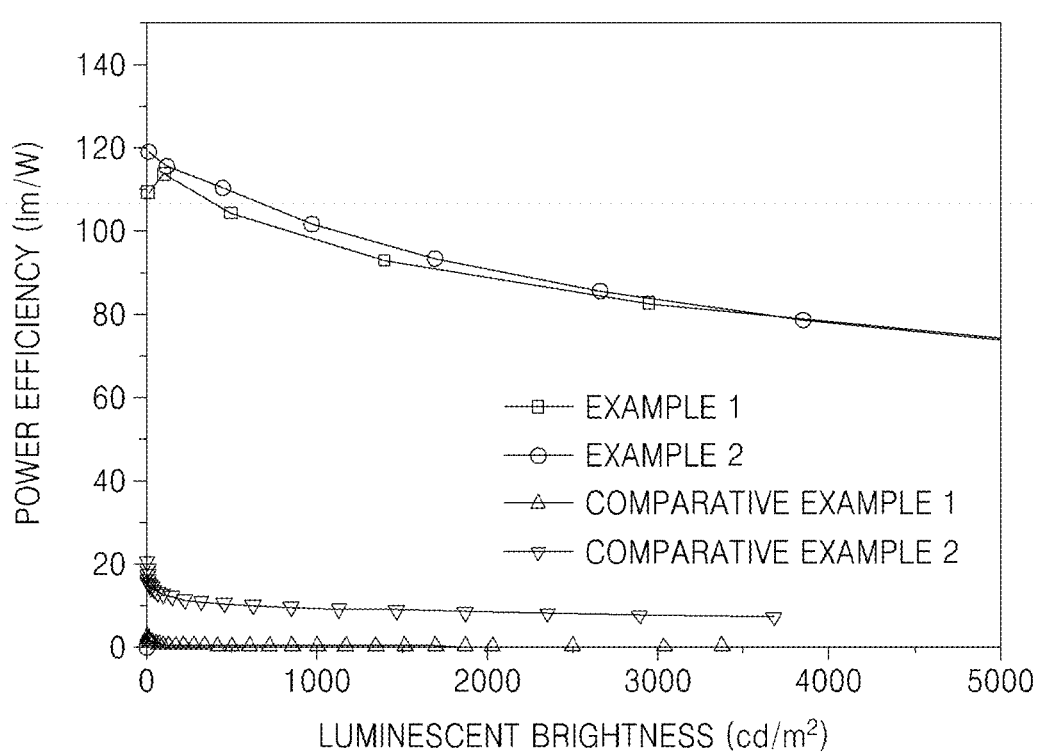
FIG. 7B is a graph showing power efficiency values of OLEDs described in Examples 1 to 2 and Comparative Examples 1 to 2.

External quantum efficiencies and power efficiencies based on the measured current density-voltage-luminance data with respect to the OLEDs according to the Examples 1 to 2 and the Comparative Examples 1 to 2 were calculated, and the calculation results are illustrated in FIGS. 7A and 7B.

Referring to FIG. 7A, the OLED according to the Examples 1 and 2 exhibit very high external quantum efficiencies of about 27% to about 29%, and having external quantum efficiencies of about more than 27% at 10,000 cd/m$^2$, the OLEDs according to the Examples 1 to 2 have very low efficiency roll-off characteristics. Meanwhile, the OLED according to the Comparative Example 1 exhibited a very low external quantum efficiency of about 1.1%, and the OLED according to the Comparative Example 2 exhibited an external quantum efficiency of about 20.5%. It may be predicted that the OLED according to the Comparative Example 1 exhibited a very low external quantum efficiency since the triplet energy of the dopant was higher than the triplet energy of the electron-transporting host. It can be seen from this that the OLEDs according to the Examples 1 to 2 have higher external quantum efficiencies than the OLEDs according to the Comparative Examples 1 to 2.

Referring to FIG. 7B, it can be seen that the OLEDs according to the Examples 1 to 2 have far higher power efficiencies than the OLEDs according to the Comparative Examples 1 to 2, and the OLEDs according to the Examples 1 to 2 have very high power efficiencies even at high luminance values.

After integrating the results, voltages, external quantum efficiencies, and power efficiencies with respect to the OLEDs according to the Examples 1 to 2 and the Comparative Examples 1 to 2 are exhibited in the following Table 2.

efficiencies than the OLEDs according to the Comparative Examples 1 to 2, and the OLEDs according to the Examples 1 to 2 have very high power efficiencies at high luminance values.

An OLED according to an aspect of the present disclosure has a low driving voltage and a high luminous efficiency and exhibits high efficiency characteristics at a high luminance value by using a hole-transporting host and an electron-transporting host that form an exciplex upon excitation.

A display apparatus or a lighting device according to another aspect of the present disclosure may be used in a field requiring low voltage and high efficiency characteristics by including an OLED using a hole-transporting host and an electron-transporting host that form an exciplex upon excitation.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more exemplary embodiments of the present disclosure have been described with reference to the figures, it will be understood by those of ordinary skill in the art that various changes in form and details may be made therein without departing from the spirit and scope of the present disclosure as defined by the following claims.

What is claimed is:
1. An organic light-emitting diode (OLED) comprising:
an anode;
a cathode; and
an organic layer which is disposed between the anode and the cathode,
wherein the organic layer comprises a light emitting layer, a hole transport layer, and an electron transport layer;
wherein the light emitting layer comprises a mixed host comprising a hole-transporting host, and electron-transporting host, and a fluorescent dopant;
wherein the hole-transporting host and the electron-transporting host are mixed together in a single layer;
wherein the hole-transporting host and the electron-transporting host form an exciplex together; where the energy difference between a singlet energy and a triplet energy of the exciplex is less than 0.3 eV;
wherein $\lambda_{max}$ of photoluminescence of the exciplex is about 450 nm or less; and
wherein the fluorescent dopant has a singlet energy which is lower than the singlet energy of the exciplex.

TABLE 2

| Classification | Voltage (V) | | External quantum efficiency (%) | | Power efficiency (lm/W) | |
|---|---|---|---|---|---|---|
| | Driving | @1000 cd/m$^2$ | Maximum | @1000 cd/m$^2$ | Maximum | @1000 cd/m$^2$ |
| Example 1 | 2.4 | 3.2 | 27.1 | 26.8 | 113.7 | 97.9 |
| Example 2 | 2.4 | 3.3 | 29.1 | 29.0 | 119.1 | 101.4 |
| Comparative Example 1 | 4.5 | 10.5 | 1.1 | 0.5 | 2.5 | 0.4 |
| Comparative Example 2 | 3.6 | 8.4 | 20.5 | 19.8 | 20.6 | 9.4 |

Referring to the Table 2, it can be seen that the OLEDs according to the Examples 1 to 2 have lower driving voltages, higher luminous efficiencies, and higher power 2. The OLED of claim 1, wherein the hole-transporting host and the electron-transporting host satisfy the following relational expressions 1 and 2:

(1) Lowest unoccupied molecular orbital (LUMO) energy of the hole-transporting host is greater than LUMO energy of the electron-transporting host by more than 0.2 eV and (2) Highest occupied molecular orbital (HOMO) energy of the hole-transporting host is greater than HOMO energy of the electron-transporting host by more than 0.2 eV.

3. The OLED of claim 1, wherein the hole transport layer comprises a hole-transporting material that is the same as the hole-transporting host, and the electron transport layer comprises an electron-transporting material that is the same as the electron-transporting host.

4. The OLED of claim 1, wherein the hole-transporting host, the electron-transporting host, and the fluorescent dopant are mixed at a molar ratio in the range of 100:30 to 300:1 to 100.

5. The OLED of claim 1, wherein the hole-transporting host and the electron-transporting host are mixed in a combination selected from TCTA:3TPYMB, TCTA:BmPyPB, and CBP:B3PYMPM.

6. A lighting device comprising the OLED according to claim 1.

7. A display apparatus comprising the OLED according to claim 1.

* * * * *